(12) United States Patent
Furyk et al.

(10) Patent No.: US 9,287,764 B2
(45) Date of Patent: Mar. 15, 2016

(54) ENERGY DELIVERY SYSTEM AND METHOD FOR A GATE DRIVE UNIT CONTROLLING A THYRISTOR-BASED VALVE

(71) Applicant: ALSTOM TECHNOLOGY LTD, Baden (CH)

(72) Inventors: Marek Furyk, Boyertown, PA (US); Roman Raubo, Downingtown, PA (US); John Schwartzenberg, Maple Glen, PA (US)

(73) Assignee: ALSTOM Technology Ltd., Baden (CH)

( * ) Notice: Subject to any disclaimer, the term of this patent is extended or adjusted under 35 U.S.C. 154(b) by 480 days.

(21) Appl. No.: 13/781,685

(22) Filed: Feb. 28, 2013

(65) Prior Publication Data
US 2014/0240006 A1    Aug. 28, 2014

(51) Int. Cl.
| | |
|---|---|
| H02J 7/18 | (2006.01) |
| H02P 9/18 | (2006.01) |
| H02M 1/088 | (2006.01) |
| H03K 17/12 | (2006.01) |
| H01H 9/54 | (2006.01) |
| H01H 33/59 | (2006.01) |
| H01H 47/00 | (2006.01) |
| H02J 3/18 | (2006.01) |

(52) U.S. Cl.
CPC ............. H02M 1/088 (2013.01); H03K 17/125 (2013.01); H02J 3/1864 (2013.01)

(58) Field of Classification Search
USPC .......................................................... 307/99
See application file for complete search history.

(56) References Cited

U.S. PATENT DOCUMENTS

| | | | |
|---|---|---|---|
| 4,434,376 A | 2/1984 | Hingorani | |
| 4,451,777 A | 5/1984 | Gyugyi | |
| 6,442,051 B1 * | 8/2002 | Ryan et al. | ...................... 363/87 |
| 2012/0200165 A1 * | 8/2012 | Kansala | ........................... 307/99 |

OTHER PUBLICATIONS

International Search Report for PCT/EP2012/067868, mailed on Feb. 28, 2013.
Gupta, S.K., et al., "Damping subsynchronous resonance in power systems," IEE Proceedings: Generation, Transmission and Distribution, Institution of Electrical Engineers, GB, vol. 149, No. 6, Nov. 13, 2002, pp. 679-688.
Rai, D., et al., "Damping Subsynchronous Resonance Using a STATCOM Operating in a Phase Imbalanced Mode," Power & Energy Society General Meeting, Jul. 26, 2009, PES '09, IEEE.

* cited by examiner

*Primary Examiner* — Dharti Patel
(74) *Attorney, Agent, or Firm* — Nixon Peabody LLP; Robert E. Krebs

(57) ABSTRACT

The invention concerns energy delivery system and method for a gate drive unit controlling a thyristor-based valve (19). The system comprises at least one current transformer (22) located in the main current path of the valve.

9 Claims, 1 Drawing Sheet

ENERGY DELIVERY SYSTEM AND METHOD FOR A GATE DRIVE UNIT CONTROLLING A THYRISTOR-BASED VALVE

BACKGROUND OF THE INVENTION

1. Field of the Invention

This invention concerns energy delivery system and method for a gate drive unit controlling a thyristor-based valve. it relates notably to FACTS («Flexible AC Transmission System»). The field of the invention is the field of power electronics related to the thyristor-based valve design.

2. Description of the Related Art

In such a field, both HVDC ("High Voltage Direct Current") and FACTS use power electronic converters for the power conversion and power quality control. High power thyristors have been serving as the key component in HVDC and FACTS converters for several decades now and are still being further developed for higher power rating nowadays. Many thyristors connected in series together with specially designed auxiliary mechanical and electronic systems build so called thyristor valves, which forms the HVDC and FACTS converters.

FACTS thyristor valves serve industrial and utility markets. Such applications may require two different branch topologies: TCR (Thyristor Controlled Reactor) and TSC (Thyristor Switched Capacitor). Due to the switching (turn on and turn off) principles, TCR and TSC topologies may require different energy delivery systems to each one of the gate drive units on each thyristor level. Following are the key methods of providing energy or power to the gate drive units:

from main power circuit:
  a. a method using the voltage across damping/grading circuits during thyristor off-state with snubber pickup methodology;
  b. a method using the current in the main power circuit via a current transformer exposed to a bidirectional AC current waveform;

from the ground level:
  a. a method accomplished magnetically via a high voltage isolating transformer, as shown in FIG. 1;
  b. an optical method via a laser and a fiber.

As shown in FIG. 1, a known ground level power supply methodology illustrates an energy delivery system comprising the following elements:

thyristors 10, with gate drive units 11,
two induction coils 14,
a ground level based inverter 13 («Ground Level Power Supply» or GLPS),
a high voltage isolating transformer 12.

These two last elements 12 and 13 carry following deficiencies:

They are very bulky in size, thus adding to the overall size of the valve and then forcing large sizes of the valve hall. A ground level based inverter is bulky, complex and designed with the necessary voltage unreliable solution. Production of such an equipment is costly and requires significant real estate space in the valve hall. In addition usually the ground level power supply system is located on the floor level in close proximity to the thyristor valve. Any significant coolant leaks will cause shutdown of the specific thyristor branch.

They are key elements reflecting on the overall reliability and availability of the SVC (Static VAR compensator) system. In order to achieve desired reliability and longevity, they are designed with a high level of the rating margins. This fact reflects directly on their very high production costs, and need for the maintenance.

The inverter 13 as being active device which directly effects reliability of the system, is designed with the very costly magnetic components, thus further elevating the costs of the entire system.

So such a current energy delivery system for a gate drive unit controlling a thyristor-based valve, is expensive, difficult to manufacture and to test.

The purpose of the invention is to provide an energy delivery system for a gate drive unit controlling a thyristor-based valve which eliminates the above drawbacks.

SUMMARY OF THE INVENTION

The invention concerns an energy delivery system for a gate drive unit controlling a thyristor-based valve, characterized in that it comprises at least one current transformer located in the main current path of the valve.

Advantageously the thyristor-based valve comprises a stack of:
  layered heatsinks,
  thyristors, and
  current transformer coils,
arranged in a supporting structure, and supplied with feeding lines.

In an advantageous embodiment the thyristor-based valve is a FACTS valve.

Advantageously each current transformer coil is incorporated in a modified thyristor heatsink.

Advantageously separate current transformer coils are designated for each thyristor on thyristor valve level.

The invention also concerns an energy delivery method for a gate drive unit controlling a thyristor-based valve, characterized in that the energy harvest is done from at least one current transformer located in the main current path of the valve.

Advantageously a snubber pickup energy delivering method is also used.

Advantageously the invention energy delivery method is actively used in the two operating states of a valve thyristor:

Voltage withstand: the thyristor is in OFF date opposite to the conduction state, and there is no current flow via the thyristor and the main circuit of the valve, the snubber pickup energy delivery method is used.

Thyristor in conduction: the thyristor is in a conduction state. Current is flowing via the thyristors and the entire valve. The current transformer placed in the main current flow produces energy, which is supplied to the gate drive unit.

The invention system has the following advantages:

The passive current transformer coil has no high voltage withstand requirements. It is located close to the thyristor cathode potential. In difference with the current ground level power supply design, the invention system does not require any associated ground equipment. Moreover, it is inexpensive, easy to manufacture, highly reliable.

Moreover current transformer coil being a passive device results in the very high reliability and availability of the system. The invention method requires no additional equipment at the ground level, in turn eliminating very expensive high voltage transformer and ground level power supply. The invention system production costs are fractional comparing to currently used methods.

The invention enhances thyristor-based valve offerings. With the enhanced reliability, maintenance free and very cost effective energy delivery system valve become even more competitive on the FACTS markets. Pursuant preliminary conceptual tests of the use of the unidirectional current transformer coil pickup, the invention method is fully feasible for use in the final production valves.

DESCRIPTION OF THE PREFERRED EMBODIMENTS

In the field of electric power engineering and electric power transmission, a SVC (Static VAR Compensator) is used in the industrial and utility applications to increase power quality factors on the distribution and transmission lines. A key component of such a device is a thyristor valve, which is comprised of following components:
a stack of layered sets of heatsinks and thyristors, comprising:
thyristors, which are silicon devices, allowing control of the current flow via the thyristor valve,
heatsinks, which are mechanical devices allowing removal of the heat from the thyristors, driven by conduction and switching losses, thus being able to operate the thyristor valve within a wide range of voltages and currents,
auxiliary circuits as snubber circuits, gate drives, gate drive energy delivery systems allowing to reliably control the thyristor valve within specified application ranges.

So said thyristor valve is built from the layered stack of thyristors packaged in the hockey puck (or disk) type of package and heatsinks. Any other silicon devices packaged in this form factor can be utilized in the stack assembly, for example: rectifier diodes, bidirectional thyristors, IGBT's, triacs.

Figure 1:
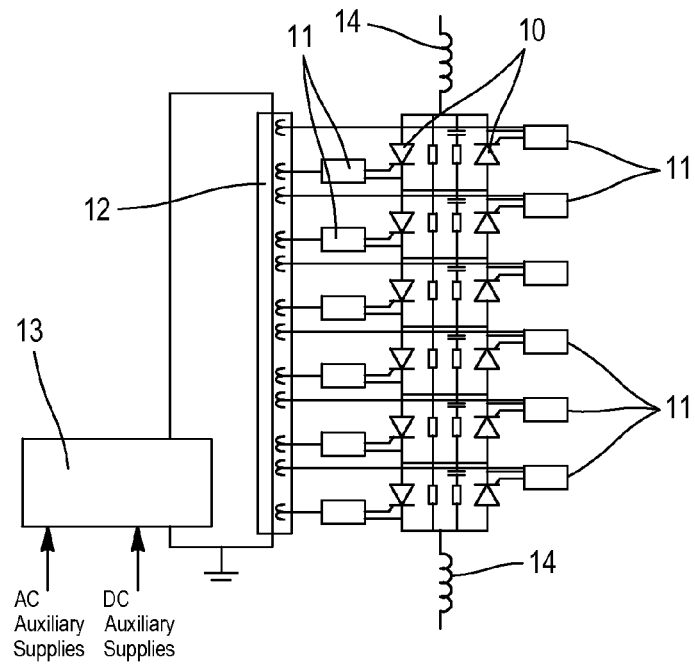
FIG. 1 shows a prior art device.
Figure 2:
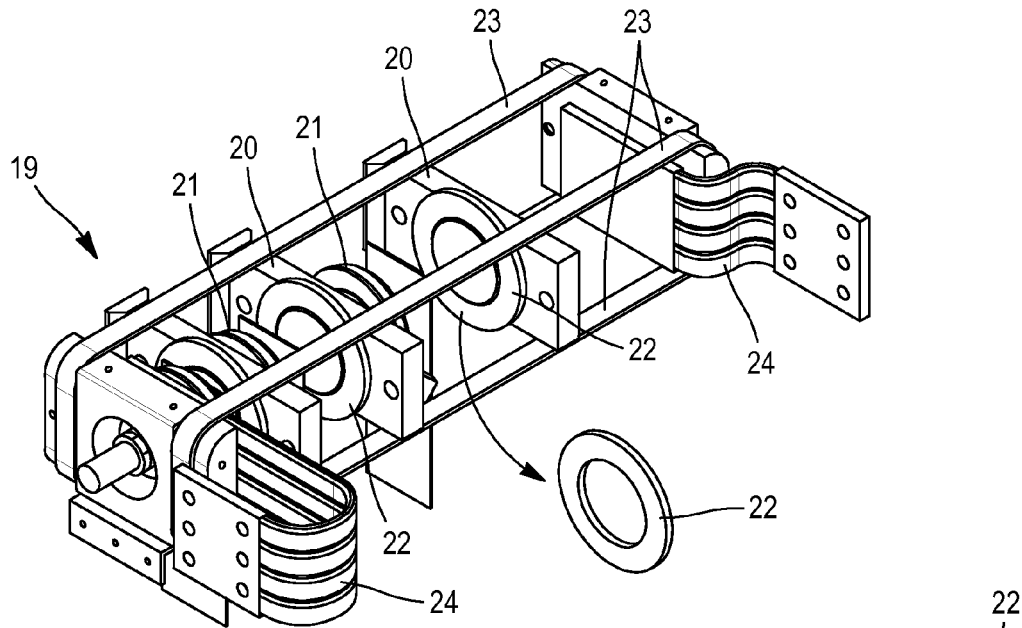
FIG. 2 shows the invention system.

As shown in FIG. 2, the invention system comprises such a thyristor valve 19, with notably a stack of:
layered heatsinks 20,
thyristors 21,
and current transformer 22,
arranged in a supporting structure 23, and supplied with feeding lines 24.

Figure 3A:
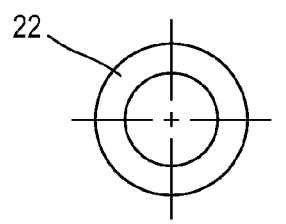
FIGS. 3A and 3B show a current transformer.
Figure 3B:

The invention proposes coil methodology based on a passive current transformer coil 22, as shown in FIGS. 3A and 3B, placed in the path of the main circuit current.

The invention consists in enhancing currently used snubber pickup energy delivering system by harvest of the energy from the main current path, while thyristor is in conduction. From the basic thyristor valve operating principles there is always one condition present while valve is in operation: voltage across the thyristor level or current through the thyristor level.

Basis of the usage of the current transformer pickup coil in assistance of the classic snubber pickup is described hereunder. Thyristor valve is designed based on the thyristor device. The invention is actively used in two operational states of the thyristor:
1. Voltage withstand: the thyristor is in OFF state opposite to the conduction state. There is no current flow via the thyristor and the main circuit of the valve. However, voltage is present across each thyristor level. This is a state when classic method of snubber pickup can be used.
2. Thyristor in conduction: The thyristor is ON state, which is a conduction state. Current is flowing via the thyristors and the entire valve. However, in this state there is no significant voltage present across the thyristor. Without significant voltage across the level classic snubber, pickup cannot produce energy for the gate drive system. However, current transformer placed in the main current flow produces energy, which can be supplied to the gate drive unit.

The thyristor-based valve, during the operation, can be only in two states: blocking with the voltage present across the levels and conducting with the current flow via thyristors and associated structure. Adding passive coil current transformer in the path of the current provides isolated energy source for gate drive on the thyristor level. A current transformer coil can be incorporated into a modified thyristor heatsink. Separate current transformer coil can be designated for each thyristor on thyristor valve level.

FIG. 2 shows application of the invention current transformer coil pickup adopted to the currently used and manufactured thyristor valve stack assembly. Current transformer pickup coils are placed on the each level on the heatsink at the thyristor cathode potential. A current transformer coil being comprised from only two major components: magnetic core and conductor wire, for example cupper wire, presents very reliable, maintenance free and cost effective solution. A current transformer coil being placed on the thyristor cathode potential totally eliminates need for very expensive high voltage isolation materials.

The invention is an alternative way of deriving energy from both main current flow path and from the voltage across the thyristor level. The key element in the invention is the application of the current transformer in the main circuit, however exposed only to the unidirectional current waveform Moreover this is also innovative, since current transformer coils are usually used in the full waveform alternating current circuits.

The invention claimed is:

1. An energy delivery system for a gate drive unit controlling a thyristor-based valve, the thyristor-based valve including a stack of multiple levels disposed in a main current path of valve and arranged in a supporting structure and supplied with feeding lines, each level comprising:
one layered heatsink, disposed between:
one thyristor packaged in a hockey-puck type package, and
one current transformer coil placed at a t cathode potential.

2. The energy delivery system of claim 1, wherein the thyristor-based valve is a FACTS valve.

3. The energy delivery system of claim 1, wherein each current transformer coil is incorporated in a modified thyristor heatsink.

4. The energy delivery system of claim 1, wherein separate current transformer coils are designated for each thyristor on thyristor valve level.

5. An energy delivery method operating the system for a gate drive unit controlling a thyristor-based valve in accordance with claim 1, wherein energy harvest is performed from at least one current transformer coil.

6. The energy delivery method of claim 5, wherein a snubber pickup energy delivering method is also used.

7. The energy delivery method of claim 5, which is actively used in the two operating states of a valve thyristor.

8. The energy delivery method of claim 7, wherein, when a thyristor is in OFF state opposite to the conduction state, and there is no current flow via the thyristor and the main circuit of the valve, the snubber pickup energy delivering method is used.

9. The energy delivery method of claim 7, wherein, when the thyristor is in a conduction state, current is flowing via the thyristors and the entire valve, the current transformer placed in the main current flow produces energy, which is supplied to the gate drive unit.

* * * * *